United States Patent [19]

Kuhnert

[11] Patent Number: 5,506,452
[45] Date of Patent: Apr. 9, 1996

[54] POWER SEMICONDUCTOR COMPONENT WITH PRESSURE CONTACT

[75] Inventor: Reinhold Kuhnert, München, Germany

[73] Assignee: Siemens Aktiengesellschaft, Munich, Germany

[21] Appl. No.: 287,781

[22] Filed: Aug. 9, 1994

[30] Foreign Application Priority Data

Aug. 9, 1993 [DE] Germany ............ 43 26 733.5

[51] Int. Cl.⁶ .................... H01L 29/54; H01L 23/18
[52] U.S. Cl. .................. 257/785; 257/719; 257/747; 257/764
[58] Field of Search .................... 257/764, 772, 257/718, 719, 727, 747, 785

[56] References Cited

U.S. PATENT DOCUMENTS

| | | | |
|---|---|---|---|
| 3,652,904 | 3/1972 | Takahashi et al. | 257/762 |
| 3,786,168 | 1/1974 | Jaecklin et al. | 174/16.3 |
| 3,789,248 | 1/1974 | Jaecklin et al. | 257/689 |
| 3,858,096 | 12/1974 | Kuhrt et al. | 257/747 |
| 3,859,143 | 1/1975 | Krebs | 29/573 |
| 3,969,754 | 7/1976 | Kuniya et al. | 257/768 |
| 4,196,442 | 4/1980 | Kuniya et al. | 257/747 |
| 4,320,571 | 3/1982 | Hauck | 257/750 |
| 4,403,242 | 9/1983 | Tsuruoka | 257/747 |
| 4,427,993 | 1/1984 | Fichot et al. | 257/747 |
| 5,008,735 | 4/1991 | Edmond et al. | 257/772 |

FOREIGN PATENT DOCUMENTS

| | | |
|---|---|---|
| 0285074 | 10/1988 | European Pat. Off. . |
| 0285074 | 3/1989 | European Pat. Off. . |
| 2023436 | 11/1970 | Germany . |
| 1514483 | 5/1971 | Germany . |
| 1279198 | 11/1972 | Germany . |
| 2139745 | 2/1973 | Germany . |
| 2449949 | 9/1975 | Germany . |
| 2824250 | 12/1978 | Germany . |
| 2015247 | 7/1982 | Germany . |
| 3731624 | 3/1989 | Germany . |
| 3838968 | 7/1989 | Germany . |

OTHER PUBLICATIONS

Patent Abstract of Japan No. JP 59-021033 (Kazuo) May 15, 1984.
Patent Abstract of Japan No. JP 57-078144 (Kenichi et al.), Aug. 17, 1982.
Patent Abstract of Japan No. JP 60-239044 (Itou), Nov. 27, 1985.
Publication: Surface and Coating Technology 49 (1991) pp. 543–547 (Dimigen et al.) "Microstructure and wear behavior of metal-containing diamond-like coatings".

Primary Examiner—Robert P. Limanek
Assistant Examiner—Alexander Oscar Williams
Attorney, Agent, or Firm—Herbert L. Lerner; Laurence A. Greenberg

[57] ABSTRACT

A power semiconductor component includes a semiconductor body having anode and cathode sides and a given thermal coefficient of expansion. Contact electrodes are each disposed on a respective one of the anode and cathode sides and are made of a metal having a thermal coefficient of expansion differing from the given thermal coefficient of expansion. At least two contact surfaces are disposed one above the other under pressure, between the semiconductor body and the contact electrodes. At least one of the contact surfaces has a layer formed of an amorphous carbon-metal compound.

11 Claims, 1 Drawing Sheet

POWER SEMICONDUCTOR COMPONENT WITH PRESSURE CONTACT

BACKGROUND OF THE INVENTION

1. Field of the Invention

The invention relates to a power semiconductor component with a semiconductor body, a contact electrode at the anode side and a contact electrode at the cathode side being made of a metal having a thermal coefficient of expansion differing from that of the semiconductor body, and at least two contact surfaces disposed one above the other under pressure between the semiconductor body and the contact electrodes.

Such power semiconductor components are state of the art, as is seen from German Published, Prosecuted Application DE-AS 1 185 728.

A problem encountered with power components of the type mentioned above is that the contact surfaces pressing against each other move relative to each other under alternating loads, due to their different thermal coefficients of expansion. That can result in frictional welding of the contact surfaces. Thus, there has been no lack of attempts in the past to find suitable material pairings for the contact surfaces that are not subject to welding.

SUMMARY OF THE INVENTION

It is accordingly an object of the invention to provide a power semiconductor component with a pressure contact, which overcomes the hereinafore-mentioned disadvantages of the heretofore-known devices of this general type in such a way that friction of contact surfaces is diminished as compared to known pairings.

With the foregoing and other objects in view there is provided, in accordance with the invention, a power semiconductor component, comprising a semiconductor body having anode and cathode sides and a given thermal coefficient of expansion; contact electrodes each being disposed on a respective one of the anode and cathode sides and being made of a metal having a thermal coefficient of expansion differing from the given thermal coefficient of expansion; at least two contact surfaces disposed one above the other under pressure, between the semiconductor body and the contact electrodes; and at least one of the contact surfaces having a layer formed of an amorphous carbon-metal compound.

In accordance with another feature of the invention, the contact surfaces are surfaces of the contact electrodes facing the semiconductor body, and the layer is disposed on at least one of the contact surfaces.

In accordance with a further feature of the invention, there is provided at least one disk disposed between at least one of the contact electrodes and the semiconductor body, the at least one disk being formed of a metal having a thermal coefficient of expansion between the thermal coefficients of expansion of the contact electrodes and the semiconductor body, and the at least one disk having two contact surfaces on which the layer is disposed.

In accordance with an added feature of the invention, there is provided a disk being bonded to the semiconductor body on the anode side, the disk being formed of a metal having a thermal coefficient of expansion between the thermal coefficients of expansion of the semiconductor body and the contact electrode on the anode side, and the disk having a contact surface facing the contact electrode on the anode side on which the layer is disposed.

In accordance with an additional feature of the invention, the metal of the layer formed of an amorphous carbon-metal compound is tungsten or molybdenum.

In accordance with yet another feature of the invention, the layer formed of an amorphous carbon-metal compound has an atomic ratio of metal to carbon of between 0.02 and 0.2 and preferably between 0.1 and 0.2.

In accordance with yet a further feature of the invention, the layer is approximately 0.5–10 μm thick.

In accordance with a concomitant feature of the invention, the layer formed of an amorphous carbon-metal compound has upper and lower surfaces with different atomic ratios of metal to carbon.

Other features which are considered as characteristic for the invention are set forth in the appended claims.

Although the invention is illustrated and described herein as embodied in a power semiconductor component with a pressure contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
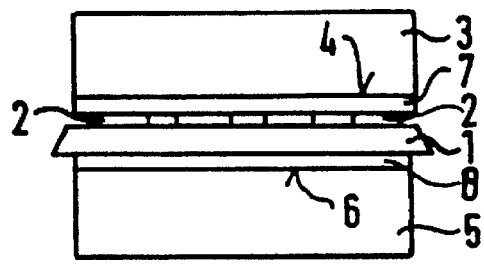
FIGS. 1–4 are diagrammatic, side-elevational views of four embodiments examples of non-encapsulated power semiconductor components.

Referring now to the figures of the drawing in detail and first, particularly, to FIG. 1 thereof, there is seen a configuration which has a semiconductor body 1 with cathode contacts 2. A contact electrode 3 is pressed against the cathode side of the semiconductor body and a contact electrode 5 is pressed against the anode side of the semiconductor body. Contact surfaces of the two contact electrodes 3 and 5 facing toward the semiconductor body 1 are respectively designated by reference numerals 4 and 6.

The contact electrodes are normally formed of copper and the semiconductor body is normally formed of silicon. Copper and silicon have very different thermal coefficients of expansion. In order to maintain low friction between the contact electrodes 3 and 5 on one hand and the semiconductor body on the other hand, the contact surfaces 4, 6 are provided with a layer 7, 8, being formed of an amorphous carbon-metal compound. For example, this carbon-metal compound can a carbon-tungsten compound or a carbon-molybdenum compound. Such an amorphous layer is obtained by depositing the compound, for example, by sputtering of a metal target or a metal carbide target in an argon-hydrocarbon atmosphere. This can occur in a high frequency field or a dc voltage field. Such techniques are known per se and therefore are not especially discussed herein. (Compare, for instance, an article by Dimigen and Klages entitled "Microstructure and wear behavior of metal-containing diamond-like coatings" in the publication Surface and Coatings Technology, 49 (1991), p. 543–547. A thickness between 0.5 and 10 μm has proven to be satisfactory for the purpose mentioned.

In these known materials, a connection exists between the resistance and the coefficient of friction of the deposited layers. This connection is also known from the above-mentioned literature. With an increasing metal/carbon ratio, the resistance of the layer decreases and the coefficient of sliding friction increases. The manufacturing process makes it possible to adjust these quantities. In order to produce a sliding layer that leaves the electrical properties of the component uninfluenced it is recommended to have an atomic ratio between 0.1 and 0.2 in the case of the tungsten/carbon system. If a particular resistance is permissible, the change to lower W/C values (<0.05 and for example 0.02) is not critical, since this further reduces the coefficient of friction.

It is also possible to apply the layers to contact electrodes being formed of a metal other than copper, e.g., aluminum or silver.

Figure 2:
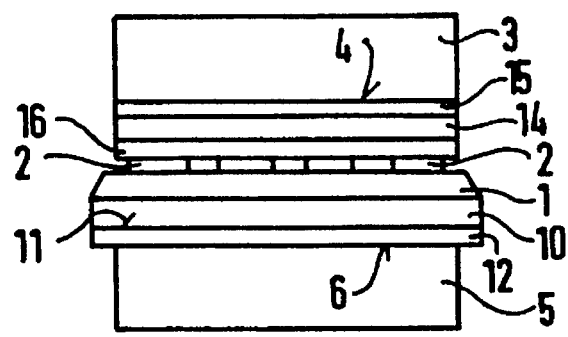

The exemplary embodiment of FIG. 2 differs from that of FIG. 1 primarily in that disks 10, 14 having a thermal coefficient of expansion which is between that of the silicon of the semiconductor body and that of the copper of the contact electrodes are disposed between the contact electrodes 3, 5 and the semiconductor body 1. The disks or wafers 10, 14 may be formed of tungsten or molybdenum, in a known manner. The disc 14 is provided with a layer 15 on its side facing the contact surface 4 of the contact electrode 3 and with a layer 16 on its side facing the semiconductor body 1. Both layers are formed of the amorphous carbon-metal compound. The disk 14 only presses against the contact electrode 3 and the semiconductor body 1 through the respective layers 15, 16. At the anode side, the semiconductor body is bonded or materially connected, such as by alloying or low-temperature combination, to the disk 10 which has a thermal coefficient of expansion which lies between that of the silicon of the semiconductor body and that of the copper of the contact electrode 5. The disk 10 has a contact surface 11 which faces the contact electrode 5 and is provided with a layer 12. The layer 12 also is formed of the amorphous carbon-metal compound. The contact electrode 5 on the anode side only presses against the layer 12 with its contact surface 6 facing the semiconductor body, and thus is not bonded or materially connected to it.

Therefore, in the event of changing loads, the disk 14 can move laterally under slight friction, both with respect to the contact electrode 3 and the semiconductor body 1. The contact electrode 5 can also move laterally with respect to the disk 10 and the semiconductor body 1.

Figure 3:
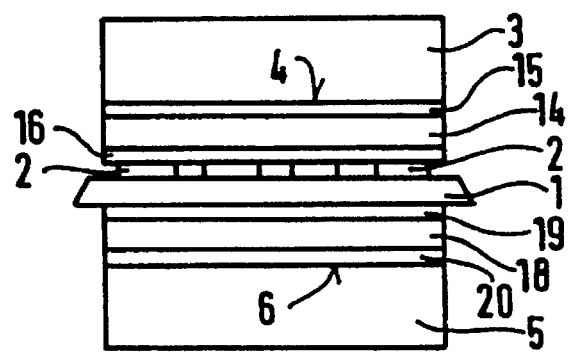

The exemplary embodiment according to FIG. 3 differs from that of FIG. 2 basically in that a molybdenum or tungsten disk 18 is placed between the semiconductor body 1 and the contact electrode 5 on the anode side. The disk 18 is provided with layers 19, 20 of the amorphous carbon-metal compound on both respective sides thereof. The disk 18 only presses against the semiconductor body 1 and the contact electrode 5 through the respective layers 19 and 20. In this case, a low-friction lateral sliding of the disk 18 is possible, both against the semiconductor body 1 and against the contact electrode 5.

Figure 4:

The atomic ratio of metal to carbon need not remain constant over the thickness of the layer. It can differ on the top or upper surface from that on the bottom or lower surface. In the exemplary embodiment of FIG. 4, a partial layer 21 abutting the contact electrode 3 has a higher atomic ratio of metal to carbon than a partial layer 22 which is provided for the sliding pressure contact. Thus, the former has a lower resistance and the latter has a lower coefficient of friction. The layer 21 is preferably thicker than the layer 22. In this way, one can combine a low contact resistance with good sliding properties.

I claim:

1. A power semiconductor component, comprising:

a semiconductor body having anode and cathode sides and a given thermal coefficient of expansion;

contact electrodes each being disposed on a respective one of said anode and cathode sides and being made of a metal having a thermal coefficient of expansion differing from said given thermal coefficient of expansion;

at least two contact surfaces disposed one above the other under pressure, between said semiconductor body and said contact electrodes; and at least one of said contact surfaces having a layer formed of an amorphous carbon-metal compound.

2. The power semiconductor component according to claim 1, wherein said contact surfaces are surfaces of said contact electrodes facing said semiconductor body, and said layer is disposed on at least one of said contact surfaces.

3. The power semiconductor component according to claim 1, including at least one disk disposed between at least one of said contact electrodes and said semiconductor body, said at least one disk being formed of a metal having a thermal coefficient of expansion between the thermal coefficients of expansion of said contact electrodes and said semiconductor body, and said at least one disk having two contact surfaces on which said layer is disposed.

4. The power semiconductor component according to claim 1, including a disk being bonded to said semiconductor body on said anode side, said disk being formed of a metal having a thermal coefficient of expansion between the thermal coefficients of expansion of said semiconductor body and said contact electrode on said anode side, and said disk having a contact surface facing said contact electrode on said anode side on which said layer is disposed.

5. The power semiconductor component according to claim 1, wherein the metal of said layer formed of an amorphous carbon-metal compound is tungsten.

6. The power semiconductor component according to claim 1, wherein the metal of said layer formed of an amorphous carbon-metal compound is molybdenum.

7. The power semiconductor component according to claim 1, wherein said layer formed of an amorphous carbon-metal compound has an atomic ratio of metal to carbon of between 0.02 and 0.2.

8. The power semiconductor component according to claim 7, wherein the atomic ratio is between 0.1 and 0.2.

9. The power semiconductor component according to claim 1, wherein said layer is approximately 0.5–10 μm thick.

10. The power semiconductor component according to claim 1, wherein said layer formed of an amorphous carbon-metal compound has upper and lower surfaces with different atomic ratios of metal to carbon.

11. A power semiconductor component, comprising:

a semiconductor body having anode and cathode sides and a given thermal coefficient of expansion;

contact electrodes each being disposed on a respective one of said anode and cathode sides and being made of a metal having a thermal coefficient of expansion differing from said given thermal coefficient of expansion;

at least two contact surfaces disposed one above the other, between said semiconductor body and said contact electrodes; and at least one of said contact surfaces having a layer formed of an amorphous carbon-metal compound for maintaining low friction between said contact electrodes and said semiconductor body, said at least one contact surface being attached substantially exclusively under pressure.

* * * * *